(12) United States Patent
Hou et al.

(10) Patent No.: US 12,063,025 B2
(45) Date of Patent: Aug. 13, 2024

(54) SYSTEM APPLIED IN SWITCH TUBE FOR CONDUCTED EMI SUPPRESSION AND DOMESTIC APPLIANCE

(71) Applicants: GUANGDONG MIDEA WHITE HOME APPLIANCE TECHNOLOGY INNOVATION CENTER CO., LTD., Foshan (CN); MIDEA GROUP CO., LTD., Foshan (CN)

(72) Inventors: Junfeng Hou, Foshan (CN); Jian Hu, Foshan (CN); Chengkai Ye, Foshan (CN)

(73) Assignees: GUANGDONG MIDEA WHITE HOME APPLIANCE TECHNOLOGY INNOVATION CENTER CO., LTD., Foshan (CN); MIDEA GROUP CO., LTD., Foshan (CN)

( * ) Notice: Subject to any disclaimer, the term of this patent is extended or adjusted under 35 U.S.C. 154(b) by 398 days.

(21) Appl. No.: 17/295,041

(22) PCT Filed: Dec. 4, 2019

(86) PCT No.: PCT/CN2019/122875
§ 371 (c)(1),
(2) Date: May 19, 2021

(87) PCT Pub. No.: WO2020/134915
PCT Pub. Date: Jul. 2, 2020

(65) Prior Publication Data
US 2022/0014164 A1    Jan. 13, 2022

(30) Foreign Application Priority Data
Dec. 24, 2018 (CN) .......................... 201811580320.3

(51) Int. Cl.
*H02P 1/26* (2006.01)
*H02P 1/32* (2006.01)
(Continued)

(52) U.S. Cl.
CPC ............... *H03H 7/06* (2013.01); *H02P 31/00* (2013.01)

(58) Field of Classification Search
CPC .................................. H02P 13/06; H02P 27/14
See application file for complete search history.

(56) References Cited

U.S. PATENT DOCUMENTS 4,422,030 A * 12/1983 McAllise ................. H02P 1/28
318/778
4,594,650 A * 6/1986 Kinbara ................. H02M 1/34
363/56.05
(Continued)

FOREIGN PATENT DOCUMENTS

CN       104538963 A    4/2015
CN       204394243 U    6/2015
(Continued)

OTHER PUBLICATIONS

European search report, European Application No. 19904494.2, mailed Oct. 18, 2021 (7 pages).
(Continued)

*Primary Examiner* — Kawing Chan
*Assistant Examiner* — Charles S Laughlin

(57) ABSTRACT

A system (10) applied in switch tube for suppressing conducted EMI and a domestic appliance are provided, and the system (10) includes a conduction EMI suppression circuit, an inductive load (1, 71, 81) and at least one switch tube (2, 72, 82). The conducted EMI suppression circuit includes one inductor (3, 73, 83, 123) and an RC circuit (4, 74, 84, 124). The inductor (3, 73, 83, 123) and each switch tube (2, 72, 82)
(Continued)

are connected in series. The inductive load (1, 71, 82) and each switch tube (2, 72, 82) are connected. The inductor (3, 73, 83, 123) are connected in series with each switch tube (2, 72, 82), and further connected in parallel with the RC circuit (4. 74, 84, 124). The conduction EMI suppression circuit is configured to suppress conducted EMI generated by each switch tube (2, 72, 82) being turned off.

10 Claims, 5 Drawing Sheets

(51) Int. Cl.
 *H02P 31/00* (2006.01)
 *H03H 7/06* (2006.01)

(56) References Cited

U.S. PATENT DOCUMENTS

| | | | |
|---|---|---|---|
| 5,990,654 A | 11/1999 | Skibinski et al. | |
| 6,215,266 B1 * | 4/2001 | Goh | H02P 6/20 |
| | | | 318/702 |
| 9,837,952 B1 | 12/2017 | Carcia et al. | |
| 2014/0022012 A1 | 1/2014 | Wilson | |

FOREIGN PATENT DOCUMENTS

| | | |
|---|---|---|
| CN | 206099746 U | 4/2017 |
| CN | 107026571 A | 8/2017 |
| CN | 111740586 A | 10/2020 |
| DE | 2640623 A1 | 3/1978 |
| EP | 0189037 A1 | 7/1986 |
| JP | S57101007 U | 6/1982 |
| JP | H09271165 A | 10/1997 |
| SE | 395573 B | 8/1977 |

OTHER PUBLICATIONS

Chinese First office action, Chinese Application No. 202110750474.8, mailed Jan. 20, 2022(13 pages).

Chinese First office action, Chinese Application No. 201811580320.3, mailed Oct. 28, 2020(16 pages).

International search report, International Application No. PCT/CN2019/122875, mailed Sep. 3, 2020(12 pages).

Analysis and Research on EMI suppression methods of switches and diodes in switching power supply,Zhu Pengtao et al., power world, Oct. 2009, pp. 40-42.

EMI Filter Design, p. 75-77,Ozenbaugh, Richard Lee,Dec. 31, 2001.

Chinese Second office action, Chinese Application No. 202110750474.8, mailed Jun. 13, 2022(12 pages).

European office action, European Application No. 19904494.2, mailed Jun. 10, 2022(6 pages).

Notification of Reexamination received in CN Application No. 202110750474.8; mailed Nov. 10, 2023.

"5.2.3IGBT practical buffer protection circuit", cited from "Pulse Width Modulation Technology", published Jan. 1996, by Li Xiwei et al., p. 127.

* cited by examiner

SYSTEM APPLIED IN SWITCH TUBE FOR CONDUCTED EMI SUPPRESSION AND DOMESTIC APPLIANCE

CROSS-REFERENCES TO RELATED APPLICATIONS

The present disclosure is a national phase application of International Application No. PCT/CN2019/122875, filed on Dec. 4, 2019, which claims the priority of Chinese Patent Application No. 201811580320.3, filed on Dec. 24, 2018 in the National Intellectual Property Administration of China, the entireties of which are herein incorporated by reference.

FIELD

The present disclosure relates to the field of domestic appliances, and in particular to a system applied in a switch tube for conducted EMI suppression, and a domestic appliance.

BACKGROUND

Electromagnetic Interference (EMI) refers to interference, which is caused by unwanted signals or noise and interferes reception or transmission of useful electromagnetic signals. The EMI generated by an electronic/electrical device is transmitted through wires or public power lines. The EMI transmitted in wires or public power lines may be called conducted EMI. The conducted EMI generated by the electronic/electrical device may be measured through an artificial line impedance stabilization network (LISN). Currently, any electronic/electrical device needs to pass a relevant conducted EMI test before being released into the market.

For an electronic/electrical device that is configured with a switch tube, such as a bidirectional thyristor, a metal oxide semiconductor (MOS) field effect transistor, and an insulated gate bipolar transistor (IGBT), when the electronic/electrical device connected to the above-mentioned switch tube is an inductive load, and when the above-mentioned switch tube is turned off, a large reverse impulse voltage may be generated at two ends of the switch tube, generating the conducted EMI. For example, when a bidirectional thyristor is connected to the inductive load, and when a reverse voltage is applied to the bidirectional thyristor, a carrier accumulation effect is generated. That is, a large number of minority carriers are stored on two sides of a PN junction, resulting in a reverse blocking ability unable to be restored. The minority carriers may be drawn out of the PN junction by the reverse voltage. In this way, a larger reverse recovery current may flow through the bidirectional thyristor, and the stored minority carriers are reduced rapidly by the reverse voltage, such that a reverse recovery current attenuates rapidly, generating a larger instantaneous current change. The larger reverse impulse voltage may be generated at two ends of the bidirectional thyristor due to the inductive load and a parasitic inductance, to generate the conducted EMI.

In order to enable electronic/electrical device to pass the conducted EMI test, an absorption circuit may be arranged at each of the two ends of the above-mentioned switch tube to provide a bypass for the reverse recovery current. FIG. 1 is a schematic diagram of an absorption circuit in the related art. As shown in FIG. 1, in the related art, a resistor-capacitor (RC) absorption circuit may be arranged, serving as the above-mentioned absorption circuit, and may be connected in parallel to the two ends of the switch tube. Practically, when a frequency of conducted EMI is low, a capacitive impedance of the RC absorption circuit is high, resulting in a low insertion loss of the RC absorption circuit. When the frequency of conducted EMI is high, a stray inductance may be present to reduce the impedance of the inductive load, resulting in the insertion loss of the RC absorption circuit remaining at a low level. A filter plate may be required to be configured at a power port to pass the conducted EMI test, which increases the cost of passing the conducted EMI test.

Therefore, a significant issue to be solved in the art may refer to providing a system applied in the switch tube for suppressing the conducted EMI, improving the effect of conducted EMI caused by suppressing the switch tube, avoiding the configuration of the filter plate, and reducing the cost of passing the conducted EMI test.

SUMMARY

In view of the shortcomings in the related art, the embodiments of the present disclosure provide a system applied in the switch tube for suppressing the conducted EMI, and a domestic appliance.

According to one embodiment of the present disclosure, a system applied in a switch tube for suppressing conducted EMI is provided and includes a conducted EMI suppression circuit, an inductive load and at least one switch tube.

The conducted EMI suppression circuit includes one inductor and an RC circuit. The inductor is connected in series with each of the at least one switch tube. The inductive load is connected with each of the at least one switch tube. The inductor is connected in series with each of the at least one switch tube, and is subsequently connected in parallel with the RC circuit. The conducted EMI suppression circuit is configured to suppress the conducted EMI generated by each of the at least one switch tube being turned off.

In some embodiments, the number of the at least one switch tube is one, the RC circuit includes one resistor and one capacitor, and the resistor and the capacitor are connected in series.

In some embodiments, the number of the at least one switch tube is more than one. Each of the more than one switch tubes is connected with the inductive load, forming more than one connecting lines. The more than one connecting lines are connected with each other in parallel. The RC circuit includes more than one RC sub-circuits. Each of the more than one RC sub-circuits corresponds to each of the more than one switch tubes. After the inductor is connected in series with each of the more than one switch tubes, the inductor is further connected in parallel the more than one RC sub-circuits corresponding to the connected switch tubes. Each of the more than one RC sub-circuits includes one resistor and one capacitor, and the resistor and the capacitor are connected in series.

In some embodiments, a resistance value of the resistor in each of the more than one RC sub-circuits is equal, and a capacitance value of the capacitor in each of the more than one RC sub-circuits is equal.

In some embodiments, the number of the at least one switch tube is more than one. Each of the more than one switch tubes is connected with the inductive load, forming more than one connecting lines. The more than one connecting lines are connected with each other in parallel. The RC circuit includes one resistor and more than one capacitors. Each of the more than one capacitors corresponds to each of the more than one switch tubes. The inductor is connected in series with each of the at least one switch tube. After each of the more than one switch tubes is connected in series with the inductor, each of the more than one switch tubes is further connected in parallel with a series circuit, and the series circuit is formed by the capacitor and the resistor corresponding to the connected switch tube.

In some embodiments, a capacitance value of each of the more than one capacitors in the RC circuit is equal.

In some embodiments, an end of the inductor is connected to a firewire, and the other end of the inductor is connected to an end of each of the at least one switch tube.

In some embodiments, each of the at least one switch tube is a bidirectional thyristor, a metal oxide semiconductor field effect transistor, or an insulated gate bipolar transistor.

In some embodiments, the inductive load is a motor.

According to another embodiment of the present disclosure, a domestic appliance is provided and includes the system applied in the switch tube for suppressing conducted EMI as described in any one of the above embodiments.

The system applied in the switch tube for suppressing the conducted EMI and the domestic appliance provided by embodiments of the present disclosure may include: a conducted EMI suppression circuit, an inductive load and at least one switch tube. The conducted EMI suppression circuit may include one inductor and an RC circuit. The inductor may be connected to each switch tube in series, and further connected in parallel with the RC circuit. As the conducted EMI suppression circuit includes both the inductor and the RC circuit, while performing the EMI test, voltage applied to the LISN is divided, and the filter plate may be omitted, reducing the cost of passing the conducted EMI test.

BRIEF DESCRIPTION OF THE DRAWINGS

In order to illustrate embodiments of the present disclosure clearly, accompanying drawings for describing the embodiments will be introduced in brief. The drawings in the following description are only some embodiments of the present application.

Figure 1:
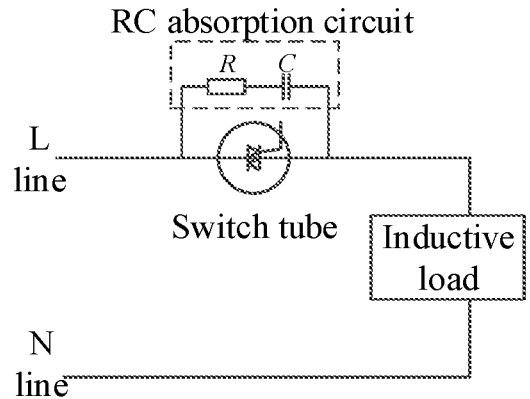
FIG. 1 is a schematic diagram of an absorption circuit in the related art.

Reference numerals in the accompanying drawings are: 1—inductive load; 2—switch tube; 3—inductor; 4—RC circuit; 10—a system applied in a switch tube for suppressing conducted EMI; 71—inductive load; 72—switch tube; 73—inductor; 74—RC circuit; 741—RC sub-circuit; 81—inductive load; 82—switch tube; 83—inductor; 84—RC circuit; 841—resistor; 842—capacitor; 121—motor; 122—bidirectional thyristor; 123—inductor; 124—RC circuit; 1241—RC sub-circuit.

DETAILED DESCRIPTION OF THE DISCLOSURE

Figure 2:
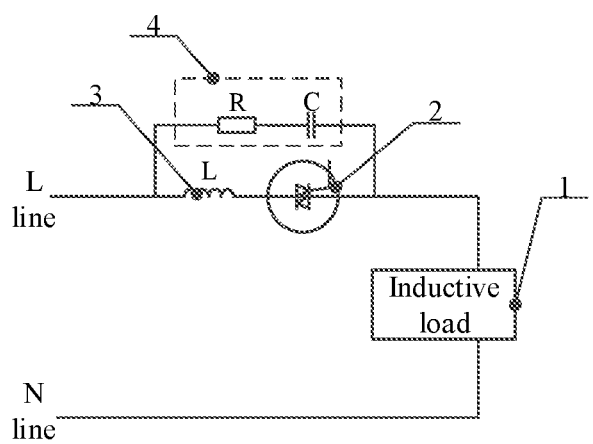
FIG. 2 is a schematic structural diagram of a system applied in a switch tube for suppressing the conducted EMI according to an embodiment of the present disclosure.

FIG. 2 is a schematic structural diagram of a system applied in a switch tube for suppressing the conducted EMI according to an embodiment of the present disclosure. As shown in FIG. 2, according to the embodiments of the present disclosure, the system applied in the switch tube for suppressing conducted EMI may include a conducted EMI suppression circuit, an inductive load 1 and at least one switch tube 2.

The conducted EMI suppression circuit may include an inductor 3 and an RC circuit 4. The inductor 3 is connected in series with each switch tube 2, the inductive load 1 is connected with each switch tube 2. The inductor 3 is connected in series with each switch tube 2, and is subsequently connected with the RC circuit 4 in parallel. The conducted EMI suppression circuit is configured to suppress the conducted EMI generated by each switch tube 2 being turned off.

In detail, the inductive load 1 may be a motor, and the switch tube 2 may be a bidirectional thyristor MOS tube or an IGBT. When switch tubes 2 are configured, only one of the plurality of switch tubes 2 may be in a conductive state at a time. An end of the inductor 3 may be connected to a firewire, and the other end of the inductor 3 may be connected to the switch tube 2. The RC circuit 4 may include a resistor and a capacitor, and the resistor and the capacitor are connected in series.

When the switch tube 2 is turned off, a relatively large reverse impulse voltage may be generated at two ends of the switch tube 2, generating the conducted EMI. When measuring the conducted EMI of the inductive load 1, an LISN needs to be connected between a power grid and the inductive load 1. A level of the conducted EMI may be reflected by a voltage received by a 5052 resistor in the LISN. A source of interference may be the reverse impulse voltage generated by the switch tube being turned off. A sensitive device may be the 50Ω resistor in the LISN between mains electricity and the inductive load. In order to illustrate an effect of the system applied in the switch tube for suppressing the conducted EMI provided by the embodiments of the present disclosure in suppressing conducted EMI, configuring the switch tube 2 as the bidirectional thyristor may be taken as an example to compare an insertion loss of the absorption circuit shown in FIG. 1 with that of the conducted EMI suppression circuit of the system applied in the switch tube for suppressing the conducted EMI provided by the embodiments of the present disclosure.

Figure 3:
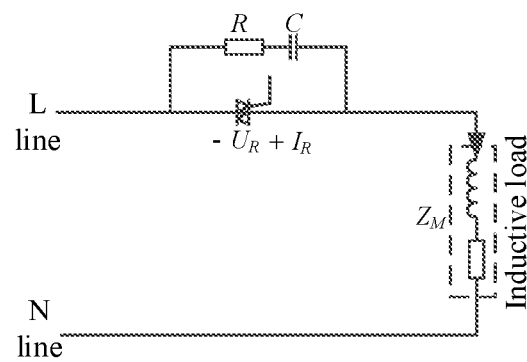
FIG. 3 is a diagram showing a working principle of two ends of a switch tube connected to an RC absorption circuit in parallel according to an embodiment of the present disclosure.

FIG. 3 is a diagram showing a working principle of each of two ends of a switch tube connected to an RC absorption circuit in parallel according to an embodiment of the present disclosure. Corresponding to the circuit structure shown in FIG. 1, the switch tube shown in FIG. 1 may be the bidirectional thyristor. As shown in FIG. 3, in order to obtain the reverse impulse voltage of the bidirectional thyristor, the inductive load may be represented by the inductor and the resistor connected in series. An impedance may be set as $Z_M$, the reverse impulse voltage of the bidirectional thyristor may be set as $U_R$, and a reverse recovery current may be set as $I_R$. According to correlation between the voltage and the current, the $U_R$ in the frequency domain may be obtained based on the following equation.

$$U_R = \frac{Z_M(R + 1/j\omega C)}{Z_M + R + 1/j\omega C} I_R \quad (1)$$

In the equation, $j=\sqrt{-1}$, $\omega$ may be a frequency of the conducted EMI, R may be a resistance value of the resistor in the RC absorption circuit, and C may be a capacitance value of the capacitor in the RC absorption circuit.

According to the substitution theorem: in a circuit having a unique solution, any two-terminal element or network, regardless of linearity of the element or the network, can be replaced by a voltage source. A function expression and a reference direction of a voltage of the voltage source may be the same as a terminal voltage of the original two-terminal element or network. Therefore, a conducted EMI measurement circuit diagram after the bidirectional thyristor being in parallel connected with the RC absorption circuit may be obtained.

As a method for analyzing the common mode conducted EMI may be the same as a method for analyzing the differential mode conducted EMI, the differential mode conducted EMI may be analyzed in the following section.

Figure 4:
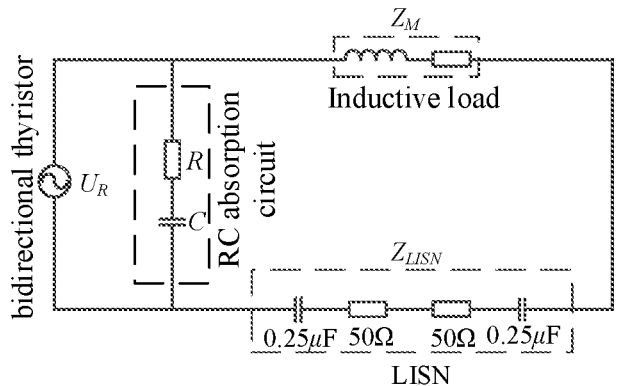
FIG. 4 is a circuit diagram for measuring the conducted EMI by configuring two ends of a bidirectional thyristor to connect to an RC absorption circuit in parallel according to an embodiment of the present disclosure.

FIG. 4 is a circuit diagram for measuring the conducted EMI by configuring two ends of a bidirectional thyristor to connect to an RC absorption circuit in parallel according to an embodiment of the present disclosure. In the circuit shown in FIG. 4, when the bidirectional thyristor is not in parallel connected with the RC absorption circuit, the voltage received by the 50Ω resistor in the LISN V1 may be obtained based on the following equation.

$$V_1 = 50 \frac{Z_M}{Z_M + Z_{LISN}} I_R \quad (2)$$

In the equation, the $Z_M$ may be the impedance of the inductive load, and the $Z_{LISN}$ may be the impedance of LISN.

In the circuit shown in FIG. 4, the voltage $V_2$ received by the 50Ω resistor in the LISN may be obtained based on the following equation.

$$V_2 = 50 \frac{Z_M(R + 1/j\omega C)}{(Z_M + Z_{LISN})(Z_M + R + 1/j\omega C)} I_R \quad (3)$$

As a large number of minority carriers accumulated in the PN junction are drawn away by the reverse voltage, the reverse recovery current may attenuate rapidly. Therefore, the RC absorption circuit of the bidirectional thyristor does not affect the attenuation of the reverse recovery current. That is, the reverse recovery current $I_R$ in the frequency domain remains unchanged. Therefore, the insertion loss $L_{RC}$ of the RC absorption circuit may be obtained based on the following equation.

$$L_{RC} = 20lg\left|\frac{V_1}{V_2}\right| = 20lg\left|1 + \frac{Z_M}{(R + 1/j\omega C)}\right| \quad (4)$$

According to the equation (4), when the frequency $\omega$ is low, the impedance of the capacitor may be high, resulting in a low insertion loss $L_{RC}$. When the frequency $\omega$ is high, the stray inductance may cause the impedance $Z_M$ of the inductive load to be reduced, the insertion loss $L_{RC}$ may not be high either.

Figure 5:
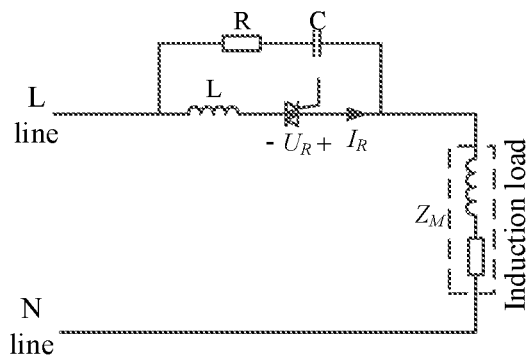
FIG. 5 is a circuit diagram showing a working principle of a system applied in a switch tube for suppressing conducted EMI for a switch tube according to an embodiment of the present disclosure.

FIG. 5 is a circuit diagram showing a working principle of a system applied in a switch tube for suppressing conducted EMI for a switch tube according to an embodiment of the present disclosure. Corresponding to the circuit structure shown in FIG. 2, as shown in FIG. 5, in order to obtain the reverse impulse voltage of the bidirectional thyristor, the inductive load may be represented by the inductor and the resistor being connected in series. The impedance may be set as $Z_M$, the reverse impulse voltage of the bidirectional thyristor may be set as $U_R$, and the reverse recovery current may be set as $I_R$. According to correlation between the voltage and the current, the $U_R$ in the frequency domain may be obtained based on the following equation.

$$U_R = \left[\frac{Z_M(R + 1/j\omega C)}{Z_M + R + 1/j\omega C} + j\omega L\right] I_R \quad (5)$$

In the equation, $j=\sqrt{-1}$, $\omega$ may be a frequency of the conducted EMI, R may be a resistance value of the resistor in the RC absorption circuit, C may be a capacitance value of the capacitor in the RC absorption circuit, and L may be an inductance value of the inductor in the conducted EMI suppression circuit.

Figure 6:
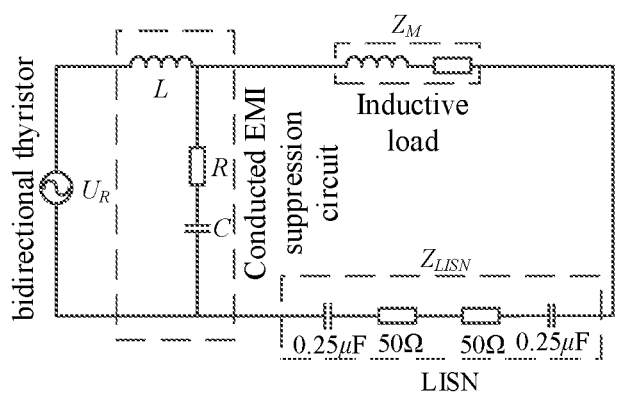
FIG. 6 is a circuit diagram for measuring a differential mode conducted EMI of a system applied in a switch tube for suppressing conducted EMI according to an embodiment of the present disclosure.

FIG. 6 is a circuit diagram for measuring a differential mode conducted EMI of a system applied in a switch tube for suppressing conducted EMI according to an embodiment of the present disclosure. In the circuit shown in FIG. 6, the voltage $V_3$ received by the 50Ω resistor in the LISN may be obtained based on the following equation.

$$V_3 = 50 \frac{(R + 1/j\omega C)//(Z_M + Z_{LISN})}{(R + 1/j\omega C)//(Z_M + Z_{LISN}) + j\omega L} \cdot \frac{Z_M//(R + 1/j\omega C) + j\omega L}{Z_M + Z_{LISN}} I_R \quad (6)$$

In the equation, // may indicate parallel connection.

The insertion loss $L_{RLC}$ of the conducted EMI suppression circuit may be obtained based on the following equation.

$$L_{RLC} = 20lg\left|\frac{V_1}{V_3}\right| = 20lg\left|\frac{1 + j\omega L\left(\frac{1}{R + 1/j\omega C} + \frac{1}{Z_M + Z_{LISN}}\right)}{\frac{R + 1/j\omega C}{R + 1/j\omega C + Z_M} + \frac{j\omega L}{Z_M}}\right| \quad (7)$$

In order to compare the insertion loss $L_{RLC}$ of the conducted EMI suppression circuit and the insertion loss $L_{RC}$ of the RC protection circuit, the impedance $Z_M$ of the inductive load in FIG. 4 may be set to be equal to that of the inductive load in FIG. 6. The resistance value of the resistor in the RC protection circuit in FIG. 4 may be set to be equal to that in the conducted EMI suppression circuit in FIG. 6. The capacitance value of the capacitor in the RC protection circuit in FIG. 4 may be set to be equal to that in the conducted EMI suppression circuit in FIG. 6. It should be understandable that the LISN in FIG. 4 is the same as the LISN in FIG. 6.

The following equation may be obtained by subtracting the equation (4) from the equation (7).

$$\Delta L = L_{RLC} - L_{RC} = 20 lg \left| 1 + \frac{\frac{1}{Z_M} - \frac{1}{Z_{LISN} + Z_M}}{\frac{1}{j\omega L} + \frac{1}{R + 1/j\omega C} + \frac{1}{Z_{LISN} + Z_M}} \right| \quad (8)$$

According to the equation (8), the ΔL increases as the L increases. Therefore, the system for suppressing conducted EMI provided by the embodiments of the present disclosure shows a significant suppression effect on the conducted EMI.

According to the embodiments of the present disclosure, the system applied in the switch tube for suppressing conducted EMI may include the conducted EMI suppression circuit, the inductive load, and at least one switch tube. The conducted EMI suppression circuit may include the inductor and the RC circuit. The inductor may be connected in series with each switch tube. The inductive load may be connected to each switch tube. The inductor may be connected in series with each switch tube, and subsequently connected in parallel with the RC circuit. The conducted EMI suppression circuit may be configured to suppress the conducted EMI generated by the switch tube being turned off. As the conducted EMI suppression circuit includes the inductor and the RC circuit, while performing the conducted EMI test, the voltage for the LISN may be divided, the filter plate may not be required, and the cost of passing the conducted EMI test may be reduced. In addition, the conducted EMI suppression circuit may further reduce reverse impulse voltage, improving the service life of the switch tube.

As shown in FIG. 2, based on the foregoing embodiments, further, one switch tube 2 may be configured, and the RC circuit 4 may include one resistor and one capacitor. The resistor and the capacitor may be connected in series.

Figure 7:
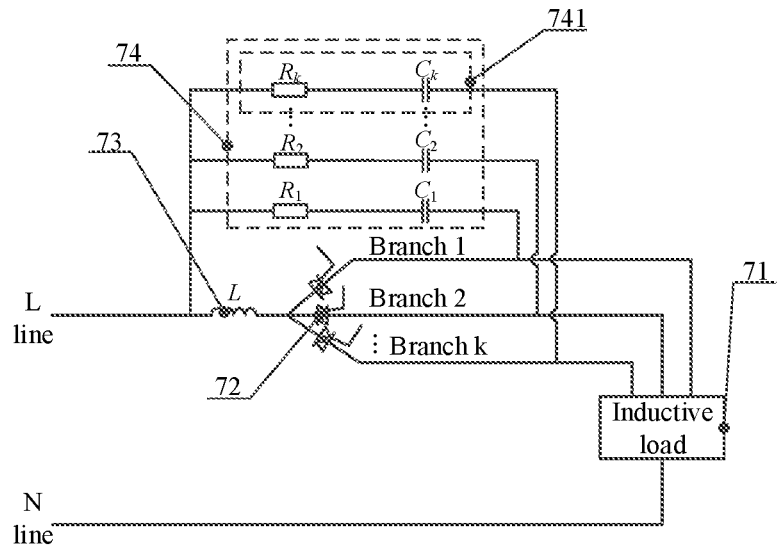
FIG. 7 is a schematic structural diagram of a system applied in a switch tube for suppressing the conducted EMI according to another embodiment of the present disclosure.

FIG. 7 is a schematic structural diagram of a system applied in a switch tube for suppressing the conducted EMI according to another embodiment of the present disclosure. Switch tubes 72 may be configured. Connecting lines between the inductive load 71 and each switch tube 72 may be connected in parallel with each other. Each connecting line between the switch tube 72 and the inductive load 71 may be a branch line. The RC circuit 74 may include RC sub-circuits 741. Each RC sub-circuit 741 corresponds to each switch tube 72. After the inductor 73 and the switch tube 72 are connected in series, the series circuit of the inductor 73 and the switch tube 72 may further be connected with the RC sub-circuit 741 corresponding to the switch tube 72 in parallel. Each RC sub-circuit 741 may include one resistor and one capacitor. The resistor and the capacitor included in each RC sub-circuit 741 may be connected in series.

Based on the foregoing embodiments, the resistance value of the resistor of each RC sub-circuit 741 may be equal, and the capacitance value of the capacitor in each RC sub-circuit 741 may be equal.

Figure 8:
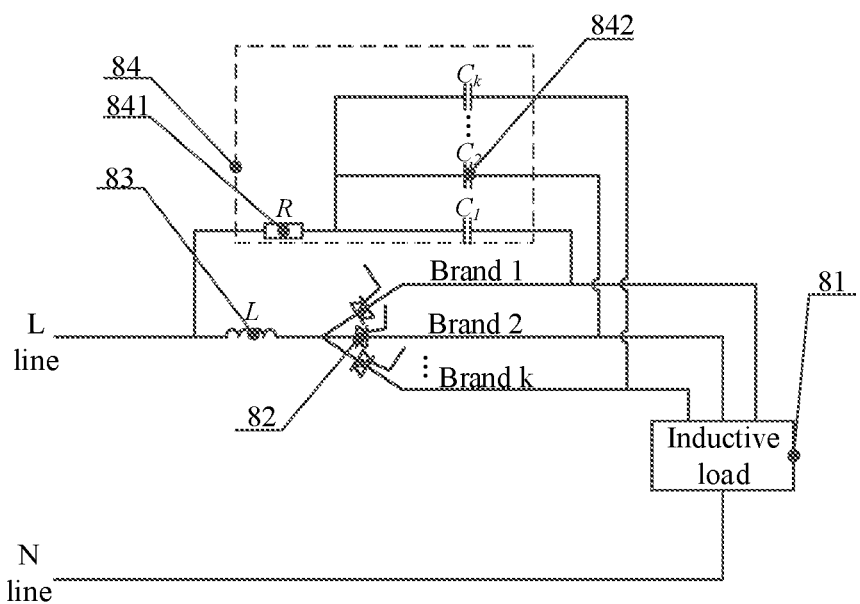
FIG. 8 is a schematic structural diagram of a system applied in a switch tube for suppressing the conducted EMI according to still another embodiment of the present disclosure.

FIG. 8 is a schematic structural diagram of a system applied in a switch tube for suppressing the conducted EMI according to still another embodiment of the present disclosure. As shown in FIG. 8, switch tubes 82 may be configured. Connecting lines between the inductive load 81 and each switch tube 82 may be connected in parallel with each other. Each connecting line between the switch tube 82 and the inductive load 81 may be a branch line. The RC circuit 84 may include one resistor 841 and capacitors 842. The resistor 841 may be connected in series with each capacitor 842, and each capacitor 751 may correspond to the switch tube 82. After the switch tube 82 is connected in series with the inductor 83, the series circuit of the switch tube 82 and the inductor 83 may be in parallel connected with a series circuit formed by capacitor 842 and the resistor 841 corresponding to the switch tube 82. Compared with the RC circuit 74 shown in FIG. 7, each capacitor 842 of the RC circuit 84 provided by the present embodiment may be connected to one common resistor 841. In this way, the cost of the system applied in the switch tube for suppressing conducted EMI may be saved.

Based on the foregoing embodiments, further, the capacitance values of the capacitors 842 included in the RC circuit 84 may be equal.

Based on the foregoing embodiments, further, an end of the inductor 3 may be connected to the firewire, i.e., the L line, and the other end of the inductor 3 may be connected to an end of each switch tube 2.

Based on the foregoing embodiments, further, the switch tube 2 may be the bidirectional thyristor, the MOS tube or the IGBT. The bidirectional thyristor may be equivalent to integration of a pair of common thyristors connected in anti-parallel, which may generally be configured in AC circuits. The thyristor, also known as a silicon controlled rectifier, is a semi-controlled device that may be turned on by a control signal but may not be controlled to be turned off. The thyristor may be turned off in response to a forward current being reduced below a value close to zero.

Based on the foregoing embodiments, further, the inductive load 1 may be a motor.

Figure 9:
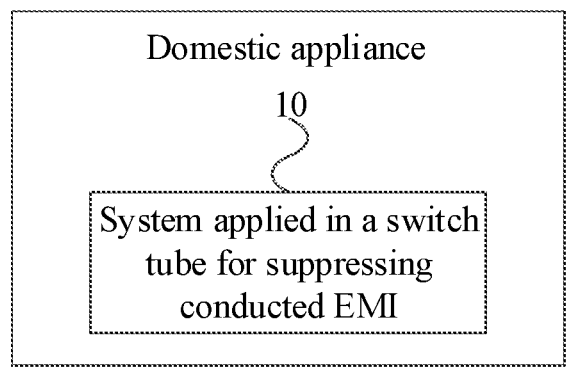
FIG. 9 is a domestic appliance according to an embodiment of the present disclosure.

FIG. 9 is a domestic appliance according to an embodiment of the present disclosure. As shown in FIG. 9, the domestic appliance provided by the embodiment of the present disclosure may include the system 10 applied in the switch tube for suppressing conducted EMI as described in any of the above embodiments. The domestic appliance may be, for example, an air conditioner, a washing machine, a refrigerator, and the like.

Figure 10:
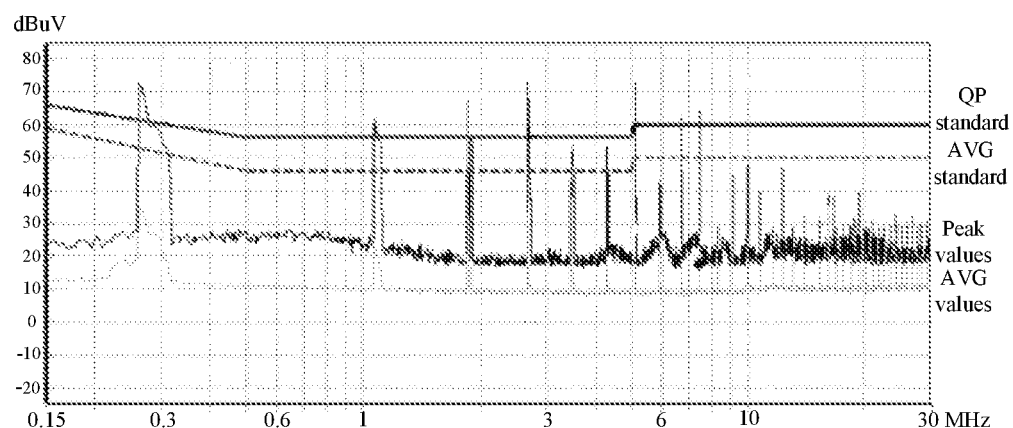
FIG. 10 is a curve of a result of a conducted EMI test performed on a cylinder washing machine in the art according to an embodiment of the present disclosure.
Figure 11:
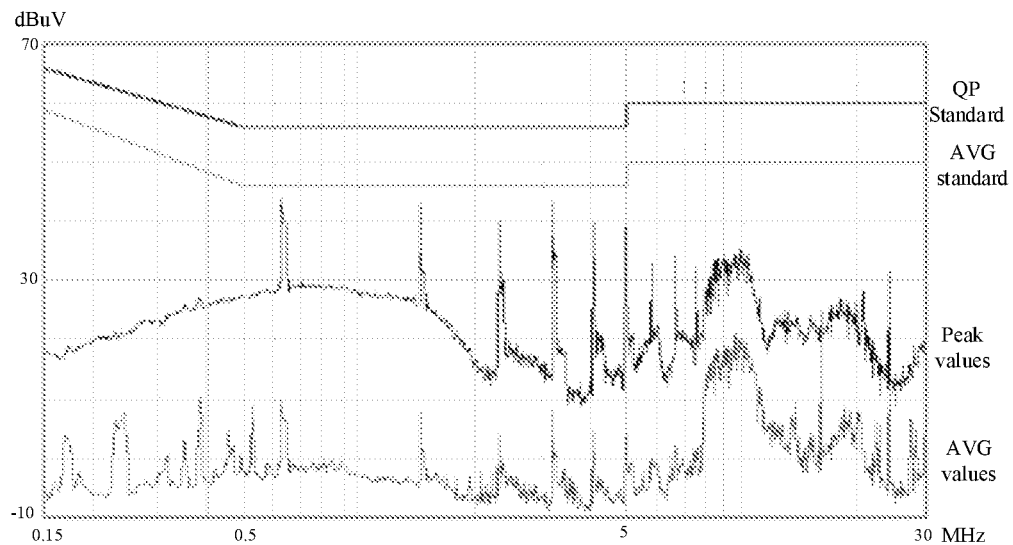
FIG. 11 is a curve of a result of a conducted EMI test performed on a cylinder washing machine according to an embodiment of the present disclosure.

In a cylinder washing machine, two bidirectional thyristors may be configured to control a motor of the cylinder washing machine to rotate forwardly and reversely, respectively. FIG. 10 is a curve of a result of a conducted EMI test performed on a cylinder washing machine in the art. The conducted EMI test result shown in FIG. 10 shows that the conducted EMI of the cylinder washing machine exceeds the national standard limit. FIG. 11 is a curve of a result of a conducted EMI test performed on a cylinder washing machine according to an embodiment of the present disclosure. By comparing FIG. 10 and FIG. 11, when configuring the system applied in the switch tube for suppressing the conducted EMI as provided by the embodiment of the disclosure, the conducted EMI of the cylinder washing machine is significantly improved, indicating that the system for suppressing conducted EMI provided by the embodiments of the present disclosure may effectively suppress the conducted EMI generated by the bidirectional thyristor being turned off.

Figure 12:
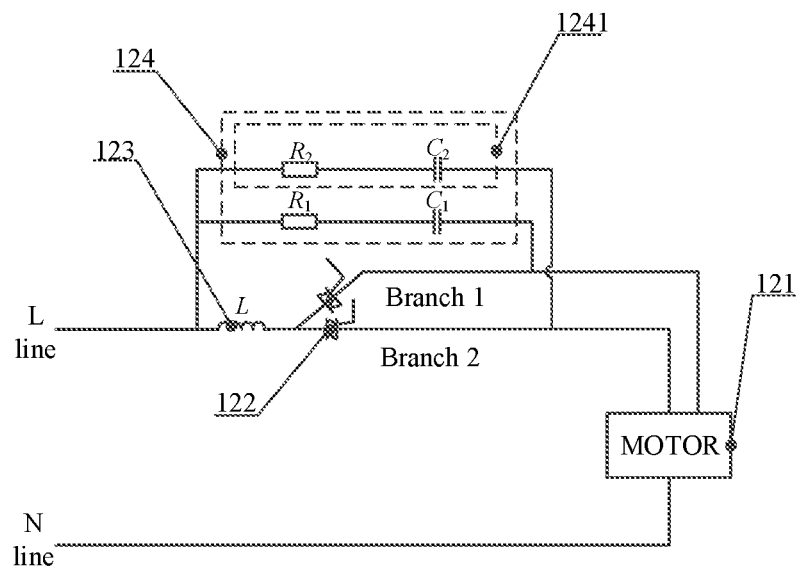
FIG. 12 is a schematic structural diagram of a system applied in a switch tube for suppressing conducted EMI applied in a cylinder washing machine according to an embodiment of the present disclosure.

FIG. 12 is a schematic structural diagram of a system applied in a switch tube for suppressing conducted EMI applied in a cylinder washing machine according to an embodiment of the present disclosure. As shown in FIG. 12, the system applied in the bidirectional thyristor for suppressing the conducted EMI as shown in FIG. 12 may be configured in the cylinder washing machine, and the results of the conducted EMI test shown in FIG. 11 may be obtained. The system applied in the bidirectional thyristor for suppressing the conducted EMI may include a conducted EMI suppression circuit, a motor 121 of the cylinder washing machine, and two bidirectional thyristors 122. The conducted EMI suppression circuit may include one inductor 123 and an RC circuit 124. The inductor 123 may be connected in series with the two bidirectional thyristors respectively. The two bidirectional thyristors 122 may be respectively connected to the motor 121. One of the two bidirectional thyristors 122 may be configured to control the motor 121 to rotate forwardly, and the other one of the two bidirectional thyristors 122 may be configured to control the motor 121 to rotate reversely. The RC circuit 124 may include two RC sub-circuits 1241. Each of the two RC sub-circuits 1241 may correspond to each of the two bidirectional thyristors 122. After the inductor 123 is connected in series with the two bidirectional thyristors 122, the inductor 123 may subsequently be connected in parallel to the RC sub-circuit 1241 corresponding to the bidirectional thyristor 122. Each RC sub-circuit 1241 may include one resistor and one capacitor, and the resistor and the capacitor included each RC sub-circuit 1241 may be connected in series.

What is claimed is:

1. A system applied in a switch component for suppressing conducted Electromagnetic Interference (EMI), comprising a conducted EMI suppression circuit, an inductive load and at least two switch tubes, wherein
    the conducted EMI suppression circuit comprises one inductor and a resistor-capacitor (RC) circuit;
    the inductor is connected in series with each of the at least two switch tubes;
    the inductive load is connected with each of the at least two switch tubes by parallel connecting lines which are connected with each other in parallel;
    the RC circuit comprises one resistor and at least two capacitors;
    each of the capacitors corresponds to a different one of the switch tubes, and the resistor is connected in series with each one of the capacitors;
    each series connection of the inductor with any one of the switch tubes is subsequently connected in parallel with a series connection of the resistor with a corresponding capacitor of the RC circuit; and
    the conducted EMI suppression circuit is configured to suppress the conducted EMI generated by each of the at least two switch tubes being turned off.

2. The system according to claim 1, wherein a capacitance value of each of the capacitors in the RC circuit is equal.

3. The system according to claim 1, wherein a first end of the inductor is connected to a positive voltage line, and a second end of the inductor is connected to an end of each of the at least two switch tubes.

4. The system according to claim 1, wherein each of the at least two switch tubes is a bidirectional thyristor or an insulated gate bipolar transistor.

5. The system according to claim 1, wherein the inductive load is a motor.

6. A appliance, comprising a system applied in a switch component for suppressing conducted Electromagnetic Interference (EMI), wherein the system comprises a conducted EMI suppression circuit, an inductive load and at least two switch tubes;
    the conducted EMI suppression circuit comprises one inductor and an RC circuit;
    the inductor is connected in series with each of the at least two switch tubes;
    the inductive load is connected with each of the at least two switch tubes by parallel connecting lines which are connected with each other in parallel;
    the RC circuit comprises one resistor and at least two capacitors;
    each of the capacitors corresponds to a different one of the switch tubes, and the resistor is connected in series with each one of the capacitors;
    each series connection of the inductor with any one of the switch tubes is subsequently connected in parallel with a series connection of the resistor with a corresponding capacitor of the RC circuit; and
    the conducted EMI suppression circuit is configured to suppress the conducted EMI generated by each of the at least two switch tubes being turned off.

7. The appliance according to claim 6, wherein a capacitance value of each of the capacitors in the RC circuit is equal.

8. The appliance according to claim 6, a first end of the inductor is connected to a positive voltage line, and a second end of the inductor is connected to an end of each of the at least two switch tubes.

9. The appliance according to claim 6, wherein each of the at least one switch tube is a bidirectional thyristor or an insulated gate bipolar transistor.

10. The appliance according to claim 6, wherein the inductive load is a motor.

* * * * *